(12) United States Patent
Jang

(10) Patent No.: US 6,229,214 B1
(45) Date of Patent: May 8, 2001

(54) METHOD FOR FABRICATING CONTACT ELECTRODE OF THE SEMICONDUCTOR DEVICE

(75) Inventor: Soon-Kyou Jang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/339,842

(22) Filed: Jun. 25, 1999

(30) Foreign Application Priority Data

Dec. 3, 1998 (KR) .................................................. 98-25173

(51) Int. Cl.[7] ........................... H01L 23/48; H01L 23/52; H01L 29/40
(52) U.S. Cl. ........................ 257/775; 257/774; 257/763; 257/764
(58) Field of Search ................................. 257/775, 774, 257/763, 764; 438/638, 629, 637, 640, 667, 668, 672, 675, 700, 701, 713, 978

(56) References Cited

U.S. PATENT DOCUMENTS

| | | | |
|---|---|---|---|
| 5,317,193 | * 5/1994 | Watanabe ............................ | 257/774 |
| 5,972,788 | * 10/1999 | Ryan et al. ........................... | 438/634 |
| 5,994,780 | * 11/1999 | Wang et al. .......................... | 257/773 |
| 6,090,703 | * 7/2000 | Bandyopadhyay et al. ......... | 438/637 |
| 6,097,103 | * 8/2000 | Ishigaki ................................ | 257/903 |
| 6,103,569 | * 8/2000 | Teo et al. .............................. | 438/253 |
| 6,110,773 | * 8/2000 | Lee ....................................... | 438/238 |
| 6,143,640 | * 11/2000 | Cronin et al. ........................ | 438/618 |

* cited by examiner

Primary Examiner—Eddie C. Lee
Assistant Examiner—Jhihan B Clark
(74) Attorney, Agent, or Firm—Jones Volentine, L.L.C.

(57) ABSTRACT

According to the present invention, a contact hole is formed by using a contact formation mask until portions of a first and a second impurity areas are respectively exposed, so that contact holes are formed. The size of the contact hole formed over the first impurity area (P-type impurity) is relatively larger than that of the contact hole formed over the second impurity area (N-type impurity). As a result, the size of the contact hole formed over an N-type impurity area decreases and that of the contact hole formed over a P-type impurity area increase to a corresponding degree, thereby reducing contact resistance generated on the P-type impurity area without increasing a chip size.

6 Claims, 9 Drawing Sheets

METHOD FOR FABRICATING CONTACT ELECTRODE OF THE SEMICONDUCTOR DEVICE

This application relies for priority upon Korean Patent Application No. 98-25173, filed on Jun. 29, 1999, the contents of which are herein incorporated by reference in their entirety.

Field of the Invention

The present invention relates to a method for fabricating a semiconductor device, and more particularly to a method for fabricating a contact electrode.

Background of the Invention

As DRAM (dynamic random access memory) devices are continuously scaled down, bit lines on these devices are increasingly made of a metal to improve their quality and to reduce chip size. However, metal bit lines are lower in sheet resistance than conventional bit lines overlaid in polysilicon and $WSi_x$.

Accordingly, if an equal sheet resistance is required, a pattern of a bit line made of the metal may be more delicate than a conventional pattern. Furthermore, the resistance of a contact formed on an N-type impurity area may be lower than that of a conventional contact, and a contact may be also formed on a P-type impurity area.

FIG. 1 illustrates a conventional semiconductor device, and FIGS. 2A through 2B illustrate the distribution of the contact resistance according to the size of a contact on each impurity area (annealed at 750° C., for 100 min).

Referring to FIG. 1, an N-type well 11 and a P-type well 12 are respectively formed in a semiconductor substrate 10 with a well formation mask (not shown). Afterwards, a $P^+$-type impurity area 13 is formed in the N-type well 11 with an impurity area formation mask (not shown), and an $N^+$-type impurity area 14 is formed in the P-type well with the impurity area formation mask.

Boron (B) is implanted into the $P^+$-type impurity area 13, and either arsenic (As) or phosphorous (P) is implanted into the $P^+$-type impurity area 14.

An oxide layer 16, used as an insulating layer, is formed over the semiconductor substrate 10. The oxide layer 16 is etched with a contact formation mask (not shown) until portions of the $N^+$-type impurity area 13 and the $P^+$-type impurity area 14 are respectively exposed, and so that a contact hole 17 is formed. The contact hole 17 has an equal width W over both the $P^+$-type impurity area 13 and the $N^+$-type impurity area 14. Afterwards, a metal wire 18 is formed by filling the contact hole 17 with a metal material.

Several methods of forming a metal wire 18 are possible. In one method for forming the metal wire 18, a Ti layer (not shown) is formed on both sidewalls and on a bottom surface of the contact hole 17 as well as over the oxide layer 16. Afterwards, the Ti reacts with silicon (Si) in the semiconductor substrate 10 through an annealing process, so that a $TiSi_x$ layer (that is, an ohmic layer) is formed. After the removal of the remainder of the Ti layer that did not react with the semiconductor substrate 10 from both sidewalls of the contact hole 17 and from the oxide layer 16, the contact hole 17 is filled with TiN or TiN/W, so that a metal wire is formed.

Using another possible method, a Ti layer and a TiN layer are sequentially deposited on both sidewalls of the contact hole 17, a bottom area, and the oxide layer 16. Then, an annealing process is performed to form an ohmic layer. Afterwards, the contact hole is filled with tungsten (W), so that a metal wire is formed.

Using yet another method, a Ti layer and a TiN layer are sequentially deposited on both sidewalls of the contact hole 17, a bottom area, and the oxide layer 16. Then, tungsten (W) is directly deposited to form a metal wire. Afterwards, the Ti reacts with the Si of the semiconductor substrate 10 through a later annealing process, so that an ohmic layer is formed.

In the case where a $TiSi_x$ layer is used as an ohmic layer, boron (B) ions that are doped in the $P^+$-type impurity area 13 and the $TiSi_x$ layer are reacted through a later annealing process, so that a TiB layer is formed.

Since TiB is nonconductive, however, the contact resistance increases. Also, as the doping concentration is lowered due to drain of B ions, the resistance increases. In order to reduce the surface area energy, the $TiSi_x$ layer is then agglomerated, so that an effective connecting area is reduced to increase the resistance. Arsenic (As) or phosphorous (P) doped on the $N^+$-type impurity area do not react with the Ti of the $TiSi_x$ layer.

As shown in FIGS. 2A through 2B, when a contact size is more than about 0.3 μm in diameter, the contact resistance of an N-type impurity area is less than about 300 Ω/CNT (ohms per contact) and that of a P-type impurity area is about less than 800 Ω/CNT.

On the other hand, when the contact size is reduced to be about 0.15 μm in diameter, the contact resistance increases more quickly in the $P^+$-type impurity area 13 than in the $N^+$-type impurity area 14, as shown in FIGS. 2A through 2B.

If the contact resistance generated in the P-type impurity area need not be more than 5,000 Ω/CNT for a given device design, then a chip size should increase so as to reduce the contact resistance. It is, therefore, essential to realize a technique of restraining this phenomenon.

SUMMARY OF THE INVENTION

It is a key feature of the present invention to provide a method for reducing the contact resistance generated on a P-type impurity area without increasing the chip size.

According to the present invention, the method comprises forming a first conductive well in a semiconductor substrate, forming a second conductive well in the semiconductor substrate, forming a first impurity area in the first conductive well, forming a second impurity area in the second conductive well, forming an insulating layer over the semiconductor substrate, and etching the insulating layer by using a contact hole formation mask until a portion of the first and second impurity areas are exposed, thereby forming a first contact hole and a second contact hole, respectively.

A first width of the first contact hole is preferably larger than a second width of the second contact hole. More specifically, the first width of the first contact hole is preferably at least 10% larger than the second width of the second contact hole.

The first conductive well is preferably an N-type well and the second conductive well is preferably a P-type well. Alternatively, the first impurity area may be a P-type area and the second impurity area may be an N-type area. In this latter case, the first contact hole formed over the first impurity area is preferably increased in its dimension by an amount corresponding to a decrease in the dimension of the second contact hole. The smallest contact hole formed over the first impurity area is preferably larger than the smallest contact hole formed over the second impurity area.

According to the present invention, the resulting semiconductor device comprises a semiconductor substrate, a first conductive well formed in the semiconductor substrate, a second conductive well formed in the semiconductor substrate, a first impurity area formed in the first conductive well, a second impurity area formed in the second conductive well, an insulating layer formed over the semiconductor substrate, a first contact hole formed in the insulating layer over the first impurity area, a second contact hole formed in the insulating layer over the second impurity area, a first contact electrode passing through the first contact hole and being electrically connected to the first impurity area, and a second contact electrode passing through the second contact hole and being electrically connected to the second impurity area.

The first width of the first contact hole is preferably larger than a second width of the second contact hole. More specifically, the first width of the first contact hole is preferably at least 10% larger than the second width of the second contact hole.

Alternatively, a method for fabricating a semiconductor device may comprise forming a first conductive well in a semiconductor substrate, forming a second conductive well in the semiconductor substrate, forming a first impurity area in the first conductive well, forming a second impurity area in the second conductive well, forming an first insulating layer over the semiconductor substrate, etching the first insulating layer by using a first contact hole formation mask until a portion of the second impurity area is exposed, thereby forming a first contact hole, filling the first contact hole with a metal material to form a plug that is electrically connected to the semiconductor substrate, forming a second insulating layer over the first insulating layer and the plug, and etching the first and second insulating layers by using a second contact hole formation mask until a portion of the first impurity area is exposed, thereby forming a second contact hole.

A second width of the second contact hole is preferably larger than a first width of the first contact hole. More specifically, the second width of the second contact hole is preferably at least 10% larger than the first width of the first contact hole.

The method may further comprise etching the second insulating layer by using the second contact hole formation mask until a portion of the plug is exposed, thereby forming a third contact hole.

The metal material preferably comprises at least one of tungsten (W) and titanium nitride (TiN).

Similarly a semiconductor device made with this method may comprise a semiconductor substrate, a first conductive well formed in the semiconductor substrate, a second conductive well formed in the semiconductor substrate, a first impurity area formed in the first conductive well, a second impurity area formed in the second conductive well, a first insulating layer formed over the semiconductor substrate, a first contact hole formed in the first insulating layer over the second impurity area, a plug passing through the first contact hole and being electrically connected to the second impurity area, a second insulating layer formed over the plug and the first insulating layer, a second contact hole formed in the first and second insulating layers over the first impurity area, a third contact hole formed in the second insulating layer over the plug, a first contact electrode passing through the second contact hole and being electrically connected to the first impurity area, and a second contact electrode passing through the third contact hole and being electrically connected to the plug.

A second width of the second contact hole is preferably larger than a first width of the first contact hole. More specifically, the second width of the second contact hole is preferably at least 10% larger than the first width of the first contact hole.

Alternatively, a method for fabricating a semiconductor device may comprise forming a first conductive well in a semiconductor substrate, forming a second conductive well in the semiconductor substrate, forming a first impurity area in the first conductive well, forming a second impurity area in the second conductive well, forming an first insulating layer over the semiconductor substrate, etching the first insulating layer by using a first contact hole formation mask until a portion of the first impurity area is exposed, thereby forming a first contact hole, filling the first contact hole with a metal material to form a plug that is electrically connected to the first impurity area, forming a second insulating layer over the first insulating layer and the plug, and etching the first and second insulating layers by using a second contact hole formation mask until a portion of the second impurity layer is exposed, thereby forming a second contact hole.

A first width of the first contact hole is preferably larger than a second width of the second contact hole. More specifically, the first width of the first contact hole is at least 10% larger than the second width of the second contact hole.

The method may further comprise etching the second insulating layer by using the second contact hole formation mask until a portion of the plug is exposed, thereby forming a third contact hole.

The metal material preferably comprises at least one of tungsten (W) and titanium nitride (TiN).

Similarly, a semiconductor device formed by this method may comprise Similarly, a semiconductor device formed by this method may comprise a semiconductor substrate, a first conductive well formed in the semiconductor substrate, a second conductive well formed in the semiconductor substrate, a first impurity area formed in the first conductive well, a second impurity area formed in the second conductive well, a first insulating layer formed over the semiconductor substrate, a first contact hole formed in the first insulating layer over the first impurity area, a plug passing through the first contact hole and being electrically connected to the first impurity area, a second insulating layer formed over the plug and the first insulating layer, a second contact hole formed in the first and second insulating layers over the second impurity area, a third contact hole formed in the second insulating layer over the plug, a first contact electrode passing through the third contact hole and being electrically connected to the plug, and second contact electrode passing through the second contact hole and being electrically connected to the second impurity area.

A first width of the first contact hole is preferably larger than a second width of the second contact hole. More specifically, the first width of the first contact hole is preferably at least 10% larger than the second width of the second contact hole.

In the method disclosed below, an insulating layer is etched by using a contact hole formation mask until portions of a first and a second impurity areas are respectively exposed, so that a plurality of contact holes are formed. A first contact hole formed over the first impurity area is formed to be relatively larger than a second contact hole formed over the second impurity area.

According to this method, the size of a first contact hole formed over an N-type impurity area decreases and the size of a second contact hole formed over a P-type impurity area increases by a similar margin, thereby reducing contact resistance generated on the P-type impurity area without increasing chip size.

BRIEF DESCRIPTION OF THE DRAWINGS

The foregoing features of this invention, as well as the invention itself, may be more fully understood from the following detailed description of the drawings, in which.

DETAILED DESCRIPTION OF PREFERRED EMBODIMENTS

First, second, and third preferred embodiments will be described below with reference to FIGS. 3A to 3C, FIGS. 4A to 4D, and FIGS. 5A to 5D.

First Preferred Embodiment

Figure 1:
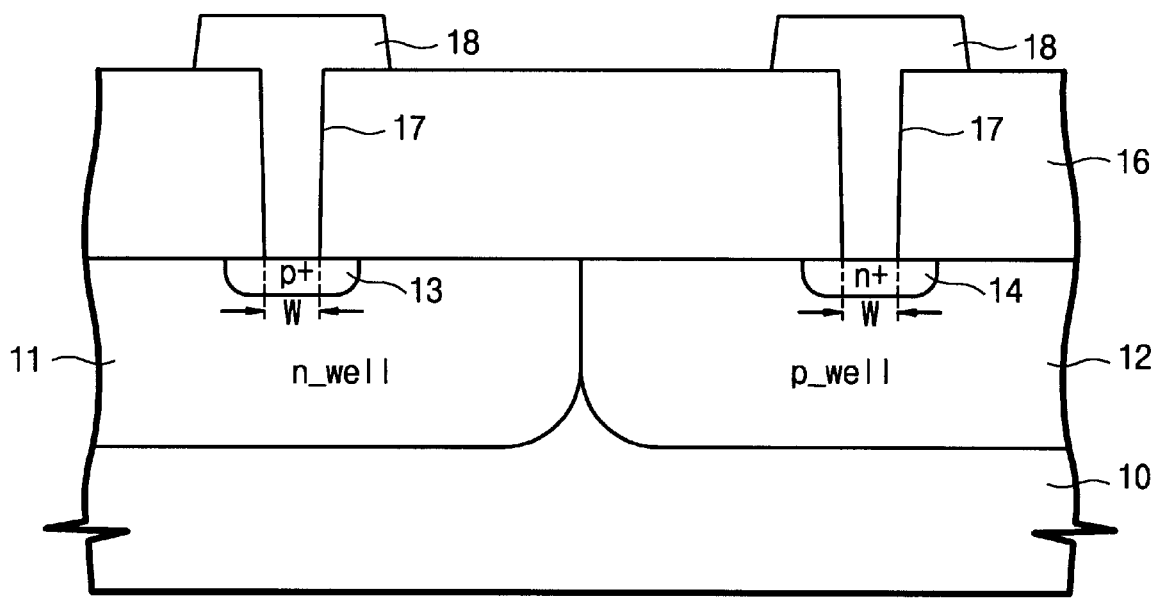
FIG. 1 is a cross-sectional view showing a contact electrode according to a conventional semiconductor device and a method for fabricating the same.
Figure 2A:
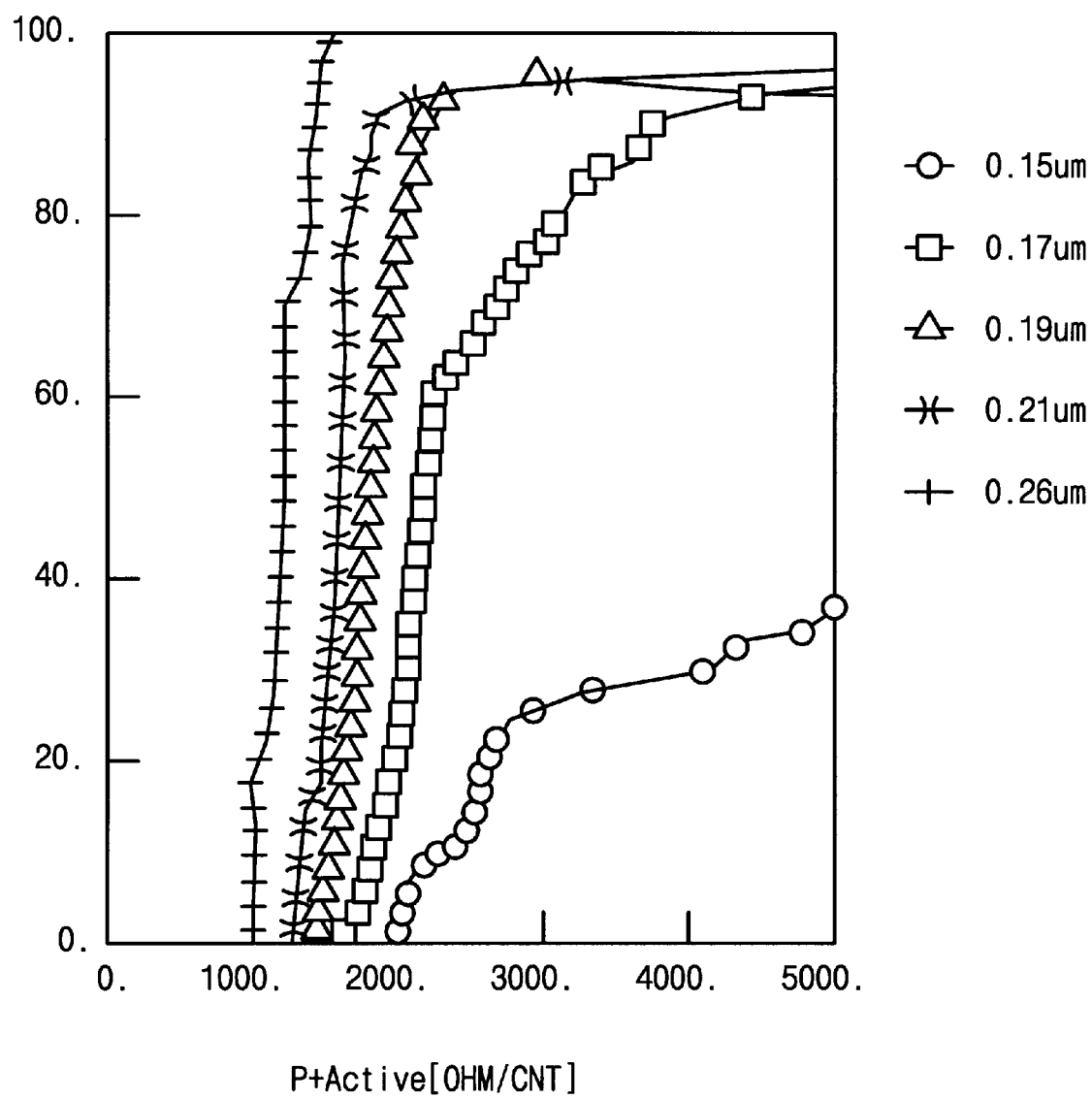
FIGS. 2A through 2B are drawings showing the distribution of contact resistance in accordance with the size of a contact hole in a conventional impurity areas.
Figure 2B:
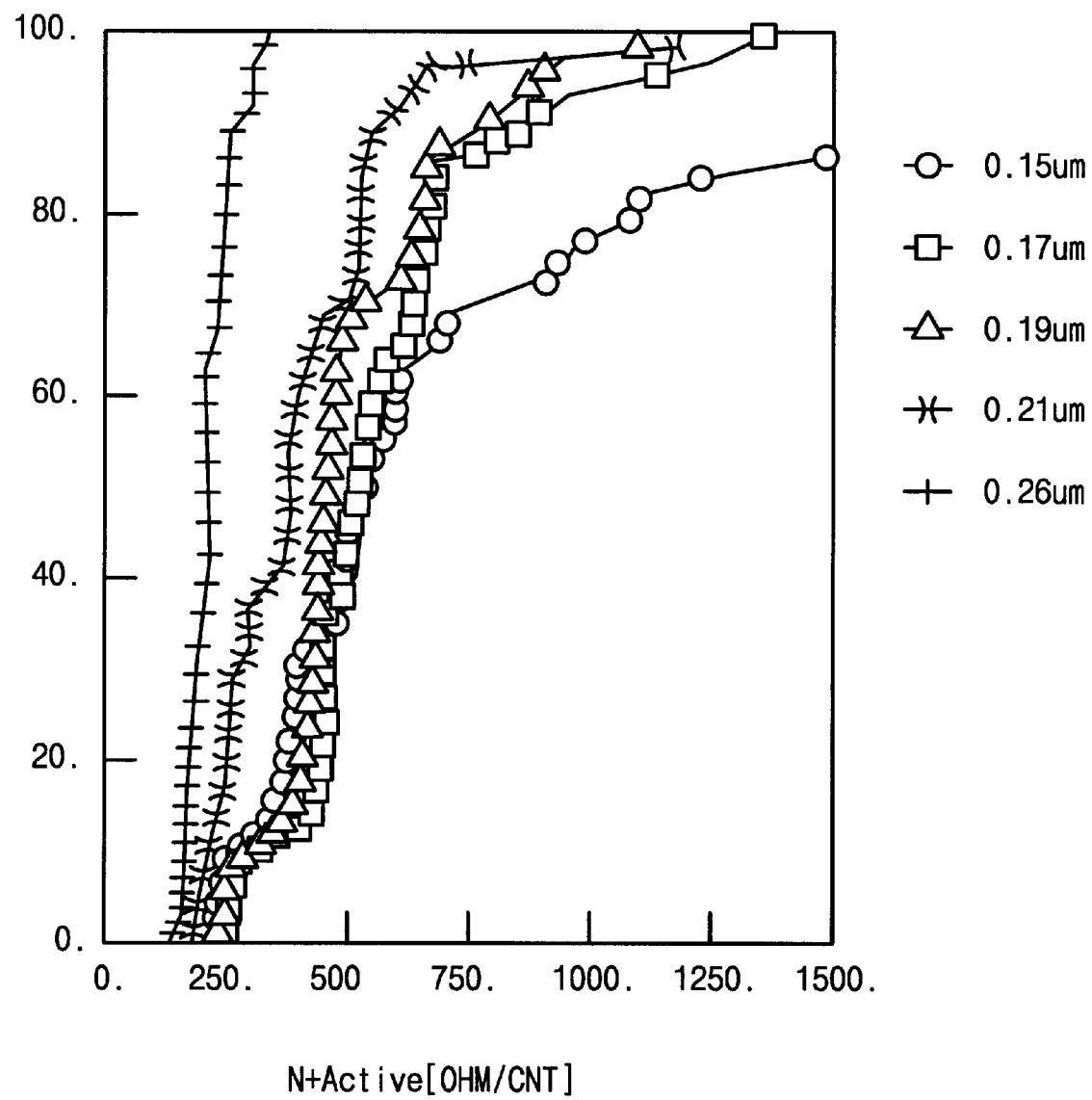
Figure 3A:
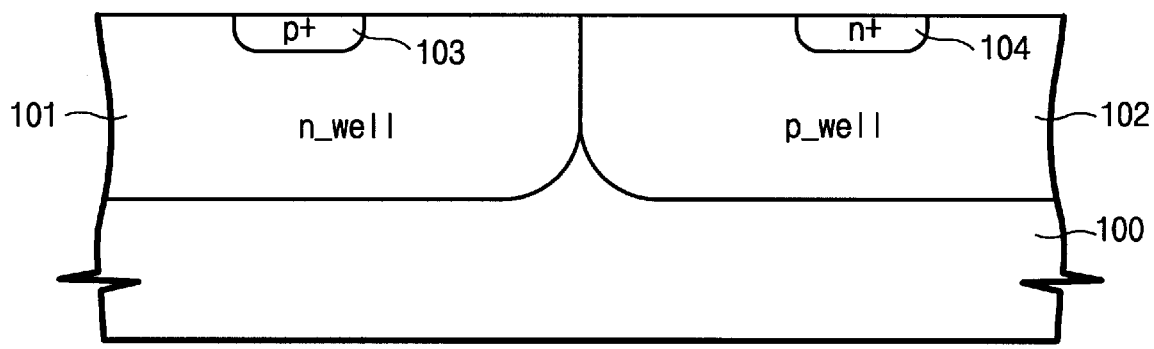
FIGS. 3A through 3C are flow diagrams showing the process steps of a method for fabricating a semiconductor device according to a first preferred embodiment of the present invention.
Figure 3B:
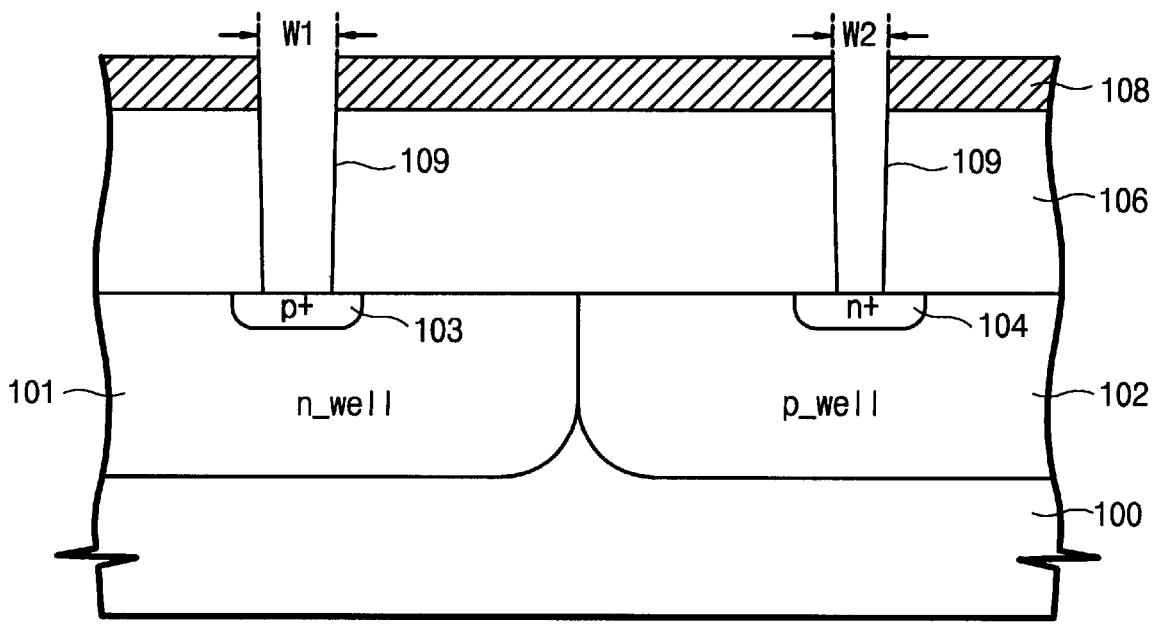
Figure 3C:
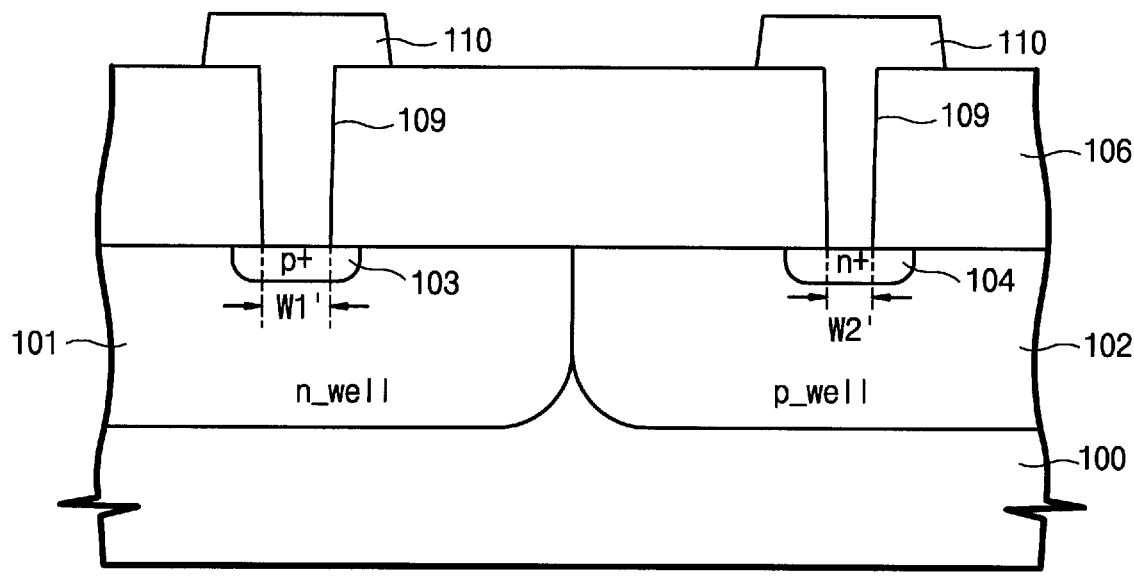

FIGS. 3A through 3C sequentially illustrate the process steps of a method for fabricating a semiconductor device according to a first preferred embodiment of the present invention.

First, referring to FIG. 3A, an N-type well 101 and a P-type well 102 are respectively formed in a semiconductor substrate 100, preferably by using a well formation mask (not shown). A $P^+$-type impurity area 103 is formed in the N-type well 101, and an $N^+$-type impurity area 104 is formed in the P-type well 102, preferably by using an impurity area formation mask (not shown). Boron (B) is preferably implanted into the $P^+$-type impurity area 103, and arsenic (As) or phosphorous (P) is preferably implanted into the N-type impurity area 104.

Next, referring to FIG. 3B, an oxide layer 106, serving as an insulating layer, is formed over the semiconductor substrate 100. The oxide layer 106 is preferably etched using a contact formation mask 108 until portions of the N-type impurity area 103 and the $P^+$-type impurity area 104 are respectively exposed, and so that contact holes 109 are formed in the oxide layer 106. A first width $W_1$ between the edges of the contact formation mask 108 over the $P^+$-type impurity area 103 is preferably larger than a second width $W_2$ between the edges of the contact formation mask 108 over the $N^+$-type impurity area 104 ($W_1 > W_2$). The shape of the contact hole 109 is preferably formed to be circular or elliptical, although other shapes can also be used.

Finally, as shown in FIG. 3C, the contact hole 109 is filled with a metal material, so that a metal wire 110 electrically connected to the semiconductor substrate 100 is formed. The metal wire is preferably made of tungsten (W) or titanium nitride (TiN).

In one method for forming the metal wire 110, a Ti layer (not shown) is formed on both sidewalls and on a bottom surface of the contact hole 109 as well as over the oxide layer 106. Afterwards, the Ti reacts with the Si of the semiconductor substrate 100 through an annealing process, so that a $TiSi_x$ layer (that is, an ohmic layer) is formed. After the removal of the remaining portion of the Ti layer that has not reacted with the semiconductor substrate 100, the contact hole is filled with TiN or TiN/W, so that a metal wire is formed.

Alternatively, a metal wire 110 may be formed as follows. After the sequential deposition of a Ti layer and a TiN layer on both sidewalls and a bottom surface of the contact hole 109 as well as over the oxide layer 106, annealing is performed to form an ohmic layer. Afterwards, the contact hole is filled with tungsten (W), so that a metal wire is formed.

Yet another method for forming a metal wire 110 is as follows. After the sequential deposition of a Ti layer and a TiN layer on both sidewalls and a bottom surface of the contact hole 109 as well as oxide layer 106, tungsten (W) is directly deposited to form a metal wire. Afterwards, the Ti reacts with the Si of the semiconductor substrate 100 through an annealing process, so that an ohmic layer is formed.

In the case that a $TiS_x$ layer is used as an ohmic layer, since the $TiSi_x$ is agglomerated through an annealing process, the size of a contact hole is reduced. Thus, an effective contact surface of a bottom of a contact hole is reduced, and so the contact resistance generated in an $N^+$-type impurity area slowly increases, while the contact resistance generated in $P^+$-type impurity area quickly increases.

To suppress this increase of the contact resistance in proportion to the reduction of the contact surface, the mask width is differently patterned in the present invention. Consequently, the first width $W_1'$ of the contact hole 109 formed over the $P^+$-type impurity area 103 may be relatively larger than the second width $W_2'$ of the contact hole 109 formed over the $N^+$-type impurity area 104 ($W_1' > W_2'$).

If, for example, a plurality of contact holes having respectively different size are formed over the $P^+$-type and the $N^+$-type impurity areas, or over an impurity area, the smallest among the contact holes formed over the $P^+$-type impurity area is preferably larger than the largest among contact holes formed over the $N^+$-type impurity area. The resulting increase in chip size may be offset by reducing the size of contact holes formed on the $P^+$-type impurity area 104.

The size of a contact hole formed on the $N^+$-type impurity area may be reduced within a range of about 10% to 15%. If, for example, the size of a contact hole formed over conventional $P^+$-type and $N^+$-type impurity areas 103 and 104 is about 200 nm, the size of a contact hole formed on the $N^+$-type impurity area according to the present invention can be reduced to be about 170 nm. Then, the size of a contact hole formed on the $P^+$-type impurity area may maximally increased to be about 230 nm.

The contact hole 109 formed on the $P^+$-type impurity area 103 is thus preferably larger than the contact hole 109 on the $N^+$-type impurity area 104 within a size range of about 10% to 15%. Referring to FIG. 3C, the contact hole $W_1'$ formed adjacent to the $P^+$-type impurity area 103 is relatively larger than the contact hole $W_2'$ formed adjacent to the $N^+$-type impurity area 104.

It is, therefore, possible to fabricate a semiconductor device capable of decreasing the contact resistance without increasing a chip size.

Second Preferred Embodiment

FIGS. 4A through 4D sequentially illustrate the process steps of a method for fabricating a semiconductor device according to a second preferred embodiment of the present invention.

Figure 4A:
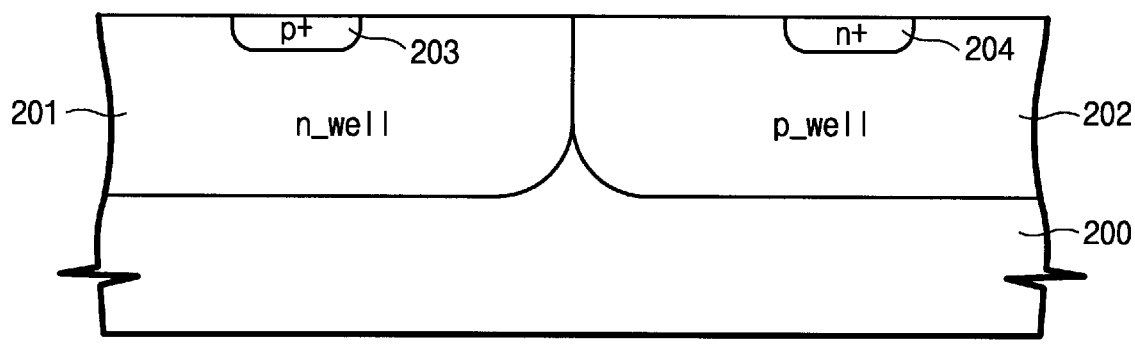
FIGS. 4A through 4D sequentially illustrate the process steps of a method for fabricating a semiconductor device according to a second preferred embodiment of the present invention.

First, referring to FIG. 4A, an N-type well 201 and a P-type well 202 are respectively formed in a semiconductor substrate 200 by using a well formation mask (not shown). A P$^+$-type impurity area 203 is formed in the N-type well 201 and an N$^+$-type impurity area 204 is formed in the P-type well 202, using an impurity area formation mask (not shown). Boron (B) is preferably implanted into the P$^+$-type impurity area 203, and arsenic (As) or phosphorous (P) is preferably implanted into the N$^+$-type impurity area 204.

Figure 4B:
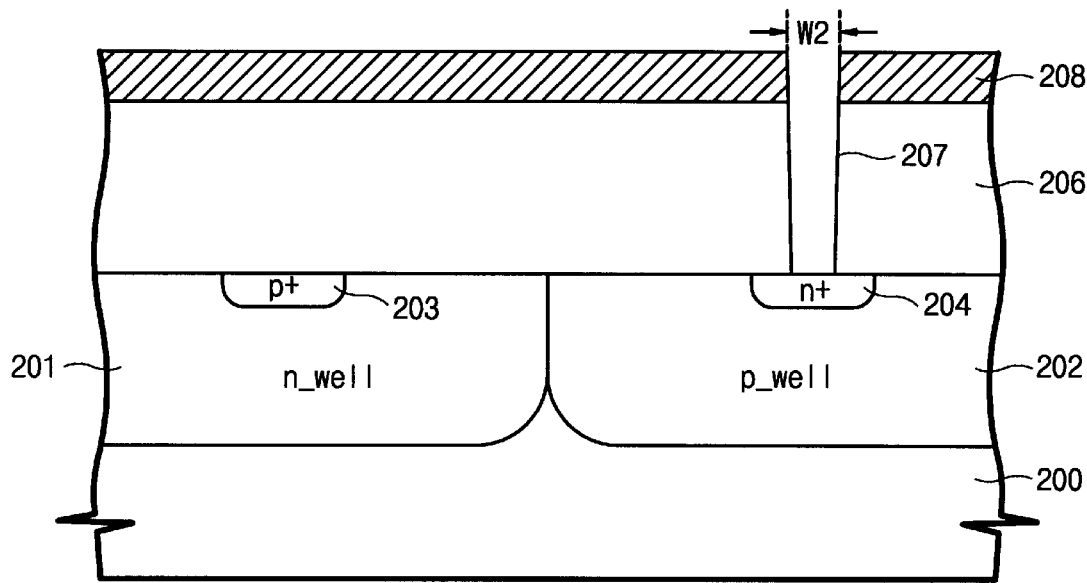

Next, a first oxide layer 206 serving as a first insulating layer is formed over the semiconductor substrate 200. The first oxide layer 206 is etched by using a first contact formation mask 208 until a portion of the N$^+$-type impurity area 204 is exposed, and so that a first contact hole 207 is formed, as shown in FIG. 4B.

Figure 4C:
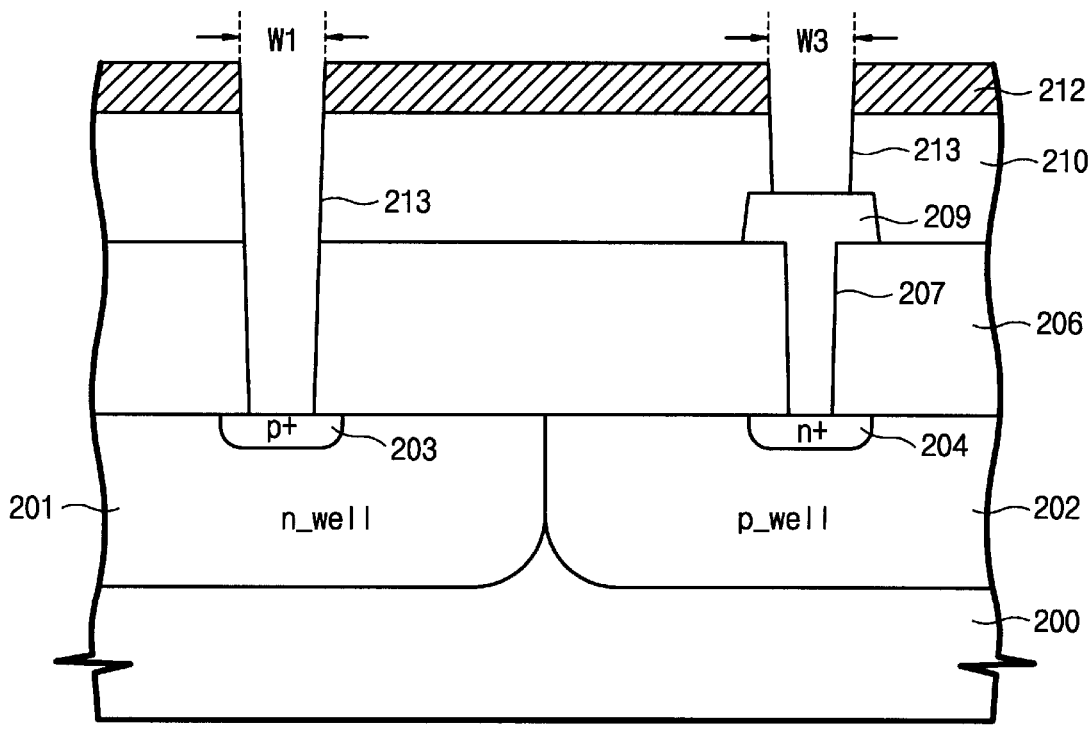

Referring to FIG. 4C, the first contact hole 207 is preferably filled with a metal material, so that a plug 209, electrically connected to the semiconductor substrate 200, is formed. The metal material is preferably either tungsten (W) or titanium nitride (TiN).

A second oxide layer 210, serving as a second insulating layer, is then formed over the first oxide layer 206 including the plug 209. The second oxide layer 210 preferably has a flat top surface. Afterwards, the second oxide layer 210 and the first oxide layer 206 are etched using a second contact formation mask 212 until portions of the plug 209 and the P$^+$-type impurity area 203 are exposed, and so that second and third contact holes 213 and 214 are formed, respectively.

Preferably, a first width $W_1$ between edges of the second contact formation mask 212 formed over the P$^+$-type impurity area 203 is the same size as a third width $W_3$ between edges of the second contact formation mask 212 formed over the plug 209 ($W_1=W_3$). However, preferably the first width $W_1$ is relatively larger than a second width $W_2$ between edges of the first contact formation mask 208 earlier formed over the N$^+$-type impurity area 204 (See FIG. 4B). Accordingly, a first size $W_1'$ of the second contact hole formed over the P$^+$-type impurity area 203 is relatively larger than the second size $W_2'$ of the first contact hole formed on the N$^+$-type impurity area 204 ($W_1'>W_2'$).

Figure 4D:
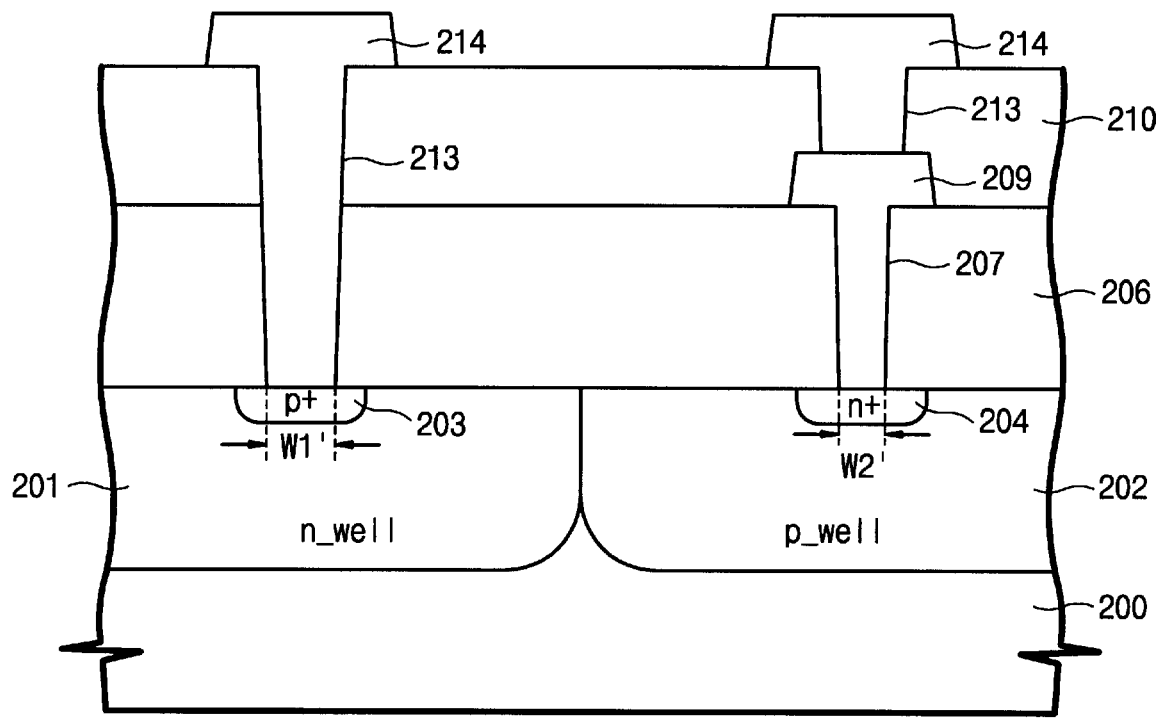

Finally, the second and third contact holes 213 and 214 are filled, preferably with a metal material, so that contact electrodes 215 are formed, as shown in FIG. 4D. The metal material for forming the contact electrodes 215 and the material for forming the plug 209 are preferably the same material.

As mentioned in the first preferred embodiment, the contact hole formed over the N$^+$-type impurity area 204 may decrease within a size range of about 10% to 15%. Similarly, a contact hole formed over the P$^+$-type impurity area 203 may increase by a similar margin.

Third Preferred Embodiment

FIGS. 5A through 5D sequentially illustrate the process steps of a method for fabricating a semiconductor device according to a second preferred embodiment of the present invention.

Figure 5A:
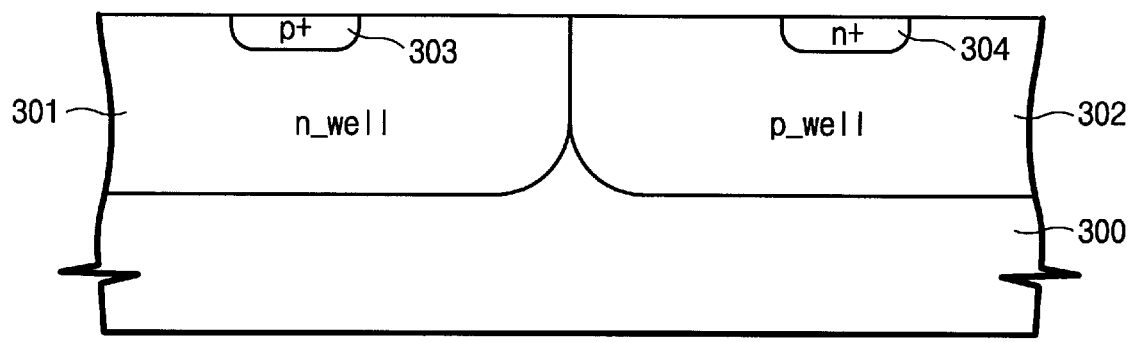
FIGS. 5A through 5D sequentially illustrate the process steps of a method for fabricating a semiconductor device according to a second preferred embodiment of the present invention.

First, referring to FIG. 5A, an N-type well 301 and a P-type well 302 are respectively formed in a semiconductor substrate 300 by using a well formation mask (not shown). A P$^+$-type impurity area 303 is formed in the N-type well 301 and an N$^+$-type impurity area 304 is formed in the P-type well 302, using an impurity area formation mask (not shown). Boron (B) is preferably implanted into the P$^+$-type impurity area 303, and arsenic (As) or phosphorous (P) is preferably implanted into the N$^+$-type impurity area 304.

Figure 5B:
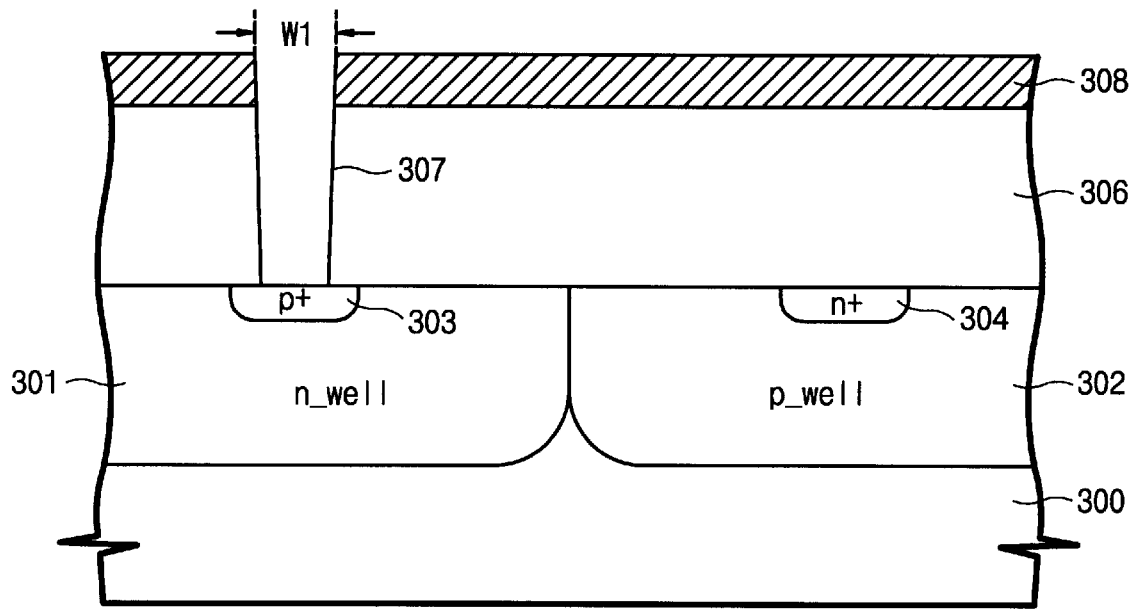

Next, a first oxide layer 306 serving as a first insulating layer is formed over the semiconductor substrate 300. The first oxide layer 306 is etched by using a first contact formation mask 308 until a portion of the P$^+$-type impurity area 303 is exposed, and so that a first contact hole 307 is formed in the oxide layer 306, as shown in FIG. 5B.

Figure 5C:
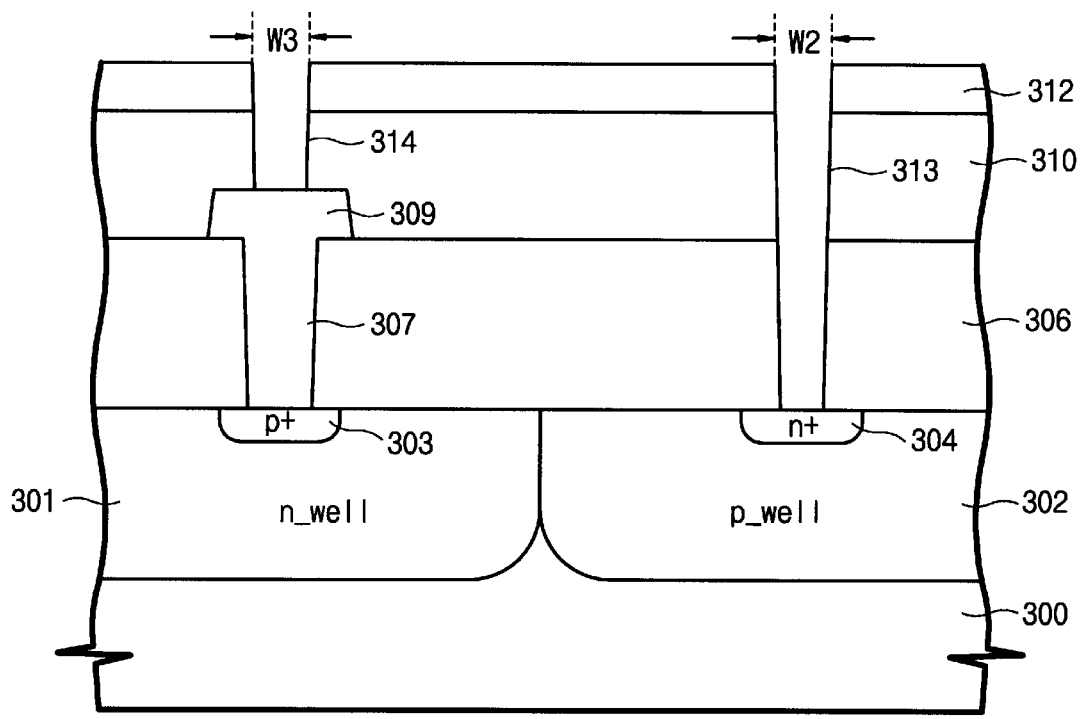

Referring to FIG. 5C, the first contact hole 307 is preferably filled with a metal material, so that a plug 309, electrically connected to the first impurity area of P-type 303 is formed. The metal material is preferably either tungsten (W) or titanium nitride (TiN).

A second oxide layer 310, serving as a second insulating layer, is then formed over the first oxide layer 306 including the plug 309. The second oxide layer 310 preferably has a flat top surface. Afterwards, the first and second oxide layers 306 and 310 are etched using a second contact formation mask 312 until portions of the second impurity area 304 and the plug 309 are exposed, and so that second and third contact holes 313 and 314 are formed, respectively.

Preferably, the second width $W_2$ between edges of the second contact formation mask 312 formed over the second impurity area of N-type 304 is the same size as a third width $W_3$ formed over the plug 309 ($W_2=W_3$). However, preferably the first width $W_1$ between edges of the first contact formation mask 308 (See FIG. 5B) earlier formed over the P$^+$-type impurity area 303 is relatively larger than a second width $W_2$ between edges of the second contact formation mask 312 over the N$^+$-type impurity area 304. Accordingly, a first size $W_1'$ of the first contact hole formed over the P$^+$-type impurity area 303 is relatively larger than the second size $W_2'$ of the second contact hole formed on the N$^+$-type impurity area 304 ($W_1'W_2'$) (See FIG. 5D).

Figure 5D:
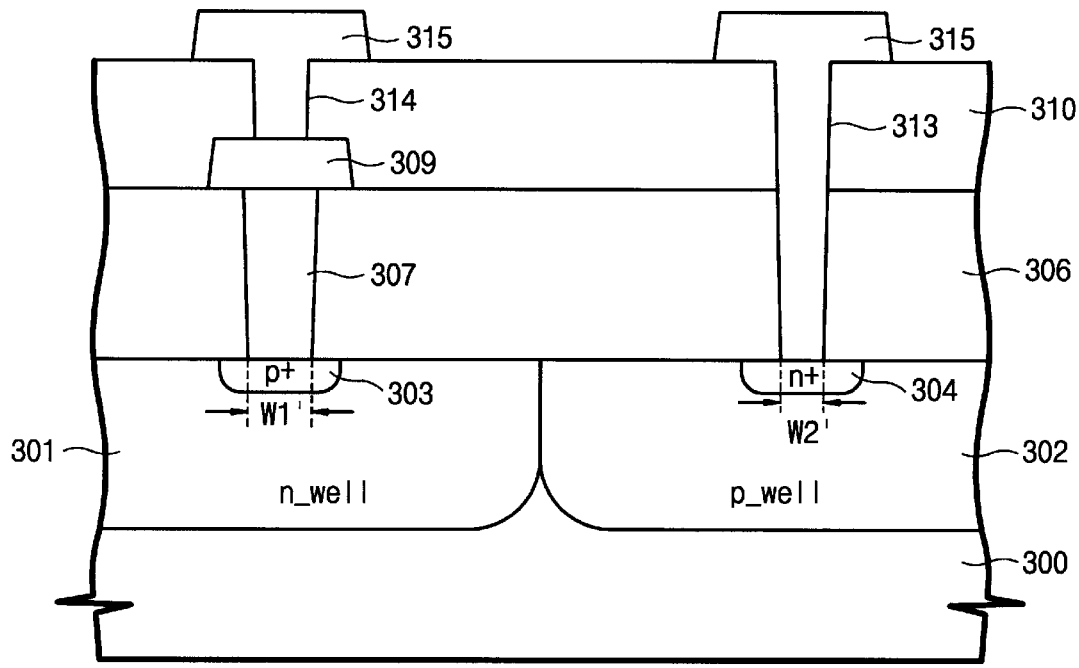

Finally, the second and third contact holes 313 and 314 are filled preferably with a metal material, so that contact electrodes 315 are formed, as shown in FIG. 5D. The metal material for forming the contact electrodes 315 and material for forming the plug 309 are preferably the same material.

As mentioned in the first preferred embodiment, the contact hole formed over the N$^+$-type impurity area 304 may decrease within a size range of about 10% to 15%. Similarly, a contact hole formed over the P$^+$-type impurity area 303 may increase by a similar margin.

According to the present invention, the size of a contact hole formed over an N-type impurity area decreases, while that of a contact hole formed on a P-type impurity area increases to a corresponding degree, thereby reducing contact resistance generated on the P-type impurity area without increasing a chip size.

Having described preferred embodiments of the invention, it will now become apparent to one of skill in the art that other embodiments incorporating their concepts may be used. It is felt, therefore, that these embodiments should not be limited to disclosed embodiments should be limited only by the spirit and scope of the appended claims.

What is claimed is:

1. A semiconductor device, comprising:
   a semiconductor substrate;
   a first conductive well formed in the semiconductor substrate;

a second conductive well formed in the semiconductor substrate;

a first impurity area formed in the first conductive well;

a second impurity area formed in the second conductive well;

an insulating layer formed over the semiconductor substrate;

a first contact hole formed in the insulating layer over the first impurity area;

a second contact hole formed in the insulating layer over the second impurity area;

a first contact electrode passing through the first contact hole and being electrically connected to the first impurity area; and a second contact electrode passing through the second contact hole and being electrically connected to the second impurity area, wherein a first width of the first contact hole is larger than a second width of the second contact hole.

2. A semiconductor device, as recited in claim 1, wherein the first width of the first contact hole is at least 10% larger than the second width of the second contact hole.

3. A semiconductor device, comprising:

a semiconductor substrate;

a first conductive well formed in the semiconductor substrate;

a second conductive well formed in the semiconductor substrate;

a first impurity area formed in the first conductive well;

a second impurity area formed in the second conductive well;

a first insulating layer formed over the semiconductor substrate;

a first contact hole formed in the first insulating layer over the second impurity area;

a plug passing through the first contact hole and being electrically connected to the second impurity area;

a second insulating layer formed over the plug and the first insulating layer;

a second contact hole formed in the first and second insulating layers over the first impurity area;

a third contact hole formed in the second insulating layer over the plug;

a first contact electrode passing through the second contact hole and being electrically connected to the first impurity area; and a second contact electrode passing through the third contact hole and being electrically connected to the plug, wherein a second width of the second contact hole is larger than a first width of the first contact hole.

4. A semiconductor device, as recited in claim 3, wherein the second width of the second contact hole is at least 10% larger than the first width of the first contact hole.

5. A semiconductor device, comprising:

a semiconductor substrate;

a first conductive well formed in the semiconductor substrate;

a second conductive well formed in the semiconductor substrate;

a first impurity area formed in the first conductive well;

a second impurity area formed in the second conductive well;

a first insulating layer formed over the semiconductor substrate;

a first contact hole formed in the first insulating layer over the first impurity area;

a plug passing through the first contact hole and being electrically connected to the first impurity area;

a second insulating layer formed over the plug and the first insulating layer;

a second contact hole formed in the first and second insulating layers over the second impurity area;

a third contact hole formed in the second insulating layer over the plug;

a first contact electrode passing through the third contact hole and being electrically connected to the plug; and a second contact electrode passing through the second contact hole and being electrically connected to the second impurity area, wherein a first width of the first contact hole is larger than a second width of the second contact hole.

6. A semiconductor device, as recited in claim 5, wherein the first width of the first contact hole is at least 10% larger than the second width of the second contact hole.

* * * * *